(12) United States Patent
Matsuda et al.

(10) Patent No.: US 11,121,094 B2
(45) Date of Patent: Sep. 14, 2021

(54) SEMICONDUCTOR DEVICES WITH SHIELD (71) Applicant: AMKOR TECHNOLOGY SINGAPORE HOLDING PTE. LTD., Singapore (SG)

(72) Inventors: Yoshio Matsuda, Chandler, AZ (US); Kenji Nishikawa, Kanagawa (JP); Seiichiro Sato, Kanagawa (JP); Yoshihiko Ikemoto, Tokyo (JP)

(73) Assignee: AMKOR TECHNOLOGY SINGAPORE HOLDING PTE. LTD., Singapore (SG)

( * ) Notice: Subject to any disclaimer, the term of this patent is extended or adjusted under 35 U.S.C. 154(b) by 0 days.

(21) Appl. No.: 16/447,222

(22) Filed: Jun. 20, 2019

(65) Prior Publication Data
US 2020/0402919 A1 Dec. 24, 2020

(51) Int. Cl.
*H01L 23/552* (2006.01)
*H01L 21/48* (2006.01)
*H01L 23/495* (2006.01)

(52) U.S. Cl.
CPC ........ *H01L 23/552* (2013.01); *H01L 21/4821* (2013.01); *H01L 23/49503* (2013.01); *H01L 23/49555* (2013.01)

(58) Field of Classification Search
CPC ............. H01L 23/552; H01L 23/49503; H01L 23/49555; H01L 21/4821
See application file for complete search history.

(56) References Cited

U.S. PATENT DOCUMENTS

| 5,294,826 | A | * | 3/1994 | Marcantonio | ......... H01L 23/315 257/659 |
| 6,627,977 | B1 | | 9/2003 | Foster | |
| 7,960,818 | B1 | * | 6/2011 | Davis | ................ H01L 23/49503 257/675 |
| 7,968,998 | B1 | | 6/2011 | Choi | |
| 2003/0025089 | A1 | * | 2/2003 | Featherby | ............. H01L 23/057 250/515.1 |
| 2005/0116145 | A1 | * | 6/2005 | Aki | ......................... H01L 31/12 250/214.1 |

(Continued)

OTHER PUBLICATIONS

"MQFP" Data Sheet, Amkor Technology, revised date Sep. 2016, 2 pages.

(Continued)

*Primary Examiner* — Sitaramarao S Yechuri
(74) *Attorney, Agent, or Firm* — McAndrews, Held & Malloy, Ltd.

(57) ABSTRACT

A semiconductor device includes a lead frame, an electronic device, a package body, and a first shield plate. The lead frame includes a die mount structure, signal leads, a first shield lead, a second shield lead, and a first shield mount that spans the first and second shield leads. The electronic device can be mounted to the die mount structure and can be coupled to the signal leads. The package body encapsulates the electronic device and the lead frame such that (i) each of the first shield lead, the second shield lead, and the signal leads includes an external portion that extends beyond the exterior surface of the package body, and (ii) the first shield mount extends beyond the exterior surface of the package body. The first shield plate can be coupled to the first shield mount.

20 Claims, 10 Drawing Sheets (56) References Cited

U.S. PATENT DOCUMENTS

| | | | | |
|---|---|---|---|---|
| 2007/0096293 A1* | 5/2007 | Wen | ................ | H01L 23/552 |
| | | | | 257/704 |
| 2007/0278632 A1* | 12/2007 | Zhao | ................ | H01L 24/97 |
| | | | | 257/676 |
| 2009/0166845 A1* | 7/2009 | Camacho | ............. | H01L 23/495 |
| | | | | 257/696 |
| 2011/0108963 A1* | 5/2011 | Balakrishnan | ...... | H01L 23/3107 |
| | | | | 257/670 |
| 2014/0117522 A1* | 5/2014 | Lim | ................ | H01L 23/49548 |
| | | | | 257/675 |
| 2015/0108625 A1* | 4/2015 | Ge | ................ | H01L 23/4334 |
| | | | | 257/675 |
| 2017/0194528 A1* | 7/2017 | Niimura | ............. | H01L 33/483 |
| 2017/0222131 A1* | 8/2017 | Chew | ................ | H01L 43/04 |

OTHER PUBLICATIONS

"LQFP/TQFP" Data Sheet, J-Devices, an Amkor Company, revised date Oct. 2018, 2 pages.

"LQFP/TQFP" Data Sheet, Leadframe, J-Devices, revised date Mar. 2015, 2 pages.

"ExposedPad", Data Sheet, Amkor Technology, revised date Mar. 2015, 2 pages.

\* cited by examiner

SEMICONDUCTOR DEVICES WITH SHIELD

FIELD OF THE DISCLOSURE

Various aspects of the present disclosure relate generally to semiconductor devices, and more particularly to lead frame semiconductor devices.

BACKGROUND

Prior semiconductor devices and methods for forming semiconductor devices are inadequate, for example resulting in excess cost, decreased reliability, relatively low performance, poor thermal properties, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

Common reference numerals are used throughout the drawings and the detailed description to indicate the same and/or similar elements.

DETAILED DESCRIPTION

Various aspects of the present disclosure can be embodied in many different forms and should not be construed as being limited to the example embodiments set forth herein. Rather, these example embodiments of the disclosure are provided so that this disclosure will be thorough and complete and will convey various aspects of the disclosure to those skilled in the art.

According to various embodiments of the present disclosure a semiconductor device includes a lead frame, an electronic device, a package body, and a first electromagnetic interference (EMI) shield. The lead frame includes signal leads and a first shield lead. The electronic device can be mounted to the lead frame and can be coupled to the signal leads. The package body includes an exterior surface having a body top surface, a body bottom surface opposite the body top surface, and body side surfaces coupling the body top surface to the body bottom surface. The package body encapsulates the electronic device and the lead frame such that the first shield lead and each of the signal leads includes an external portion that extends beyond the exterior surface of the package body. The first EMI shield can be coupled to the external portion of the first shield lead.

According to further embodiments of the present disclosure, a semiconductor device includes a lead frame, an electronic device, a package body, and a first shield plate. The lead frame includes a die mount structure, signal leads, a first shield lead, a second shield lead, and a first shield mount that spans the first and second shield leads. The electronic device can be mounted to the die mount structure and can be coupled to the signal leads. The package body includes an exterior surface having a body top surface, a body bottom surface opposite the body top surface, and body side surfaces coupling the body top surface to the body bottom surface. The package body encapsulates the electronic device and the lead frame such that (i) each of the first shield lead, the second shield lead, and the signal leads includes an external portion that extends beyond the exterior surface of the package body, and (ii) the first shield mount extends beyond the exterior surface of the package body. The first shield plate can be coupled to the first shield mount.

According to yet other embodiments of the present disclosure, a method includes encapsulating a lead frame and an electronic device mounted to the lead frame and coupled to signal leads of the lead frame in a package body such that a first shield lead and signal leads of the lead frame each includes an external portion that extends beyond an exterior surface of the package body. The package body includes an exterior surface having a body top surface, a body bottom surface opposite the body top surface, and body side surfaces coupling the body top surface to the body bottom surface. The method further includes coupling a first EMI shield to the external portion of the first shield lead.

In the drawings, the thickness of layers and regions are exaggerated for clarity. Like reference numerals refer to like elements throughout.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

The terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprise," "include, " "comprising," and "including," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. can be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

Spatially relative terms, such as "beneath," "below," "lower," "above," "upper," and the like, are used herein for ease of description to describe a relationship of an element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (rotated 90 degrees or at other orientations) and the spatially relative descriptors used herein can be interpreted accordingly.

Furthermore, the term "coplanar" and similar terms are used herein to denote two surfaces that lie within the same plane. Coplanar surfaces can be adjacent or adjoining each other; however non-adjacent and/or non-adjoining surfaces can also be coplanar. For example, a gap, a void, and/or other structures can be interposed between the coplanar surfaces. Furthermore, due to manufacturing tolerances, thermal expansion, and the like, slight deviations can exist in coplanar surfaces. Such deviations can result in one surface being slightly higher than the other surface, thus forming a step-off (e.g., a step-up or step-down) between the coplanar surfaces.

Figure 1A:
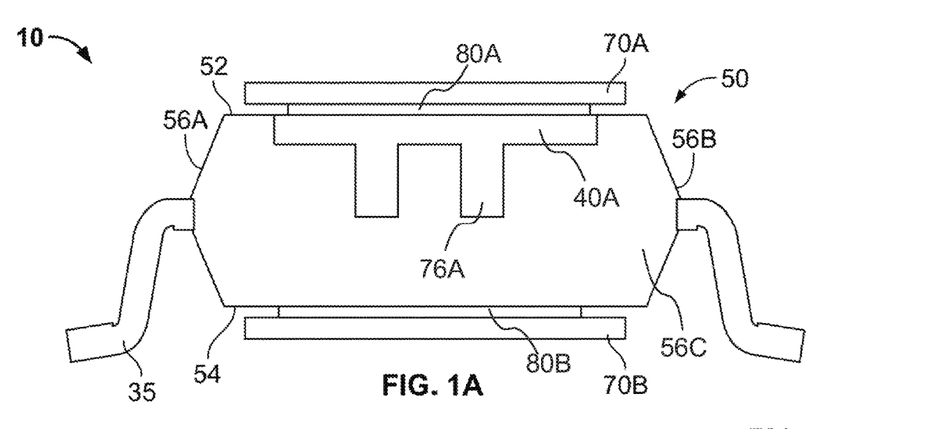
FIGS. 1A-1G depict aspects of a semiconductor device.
Figure 1B:
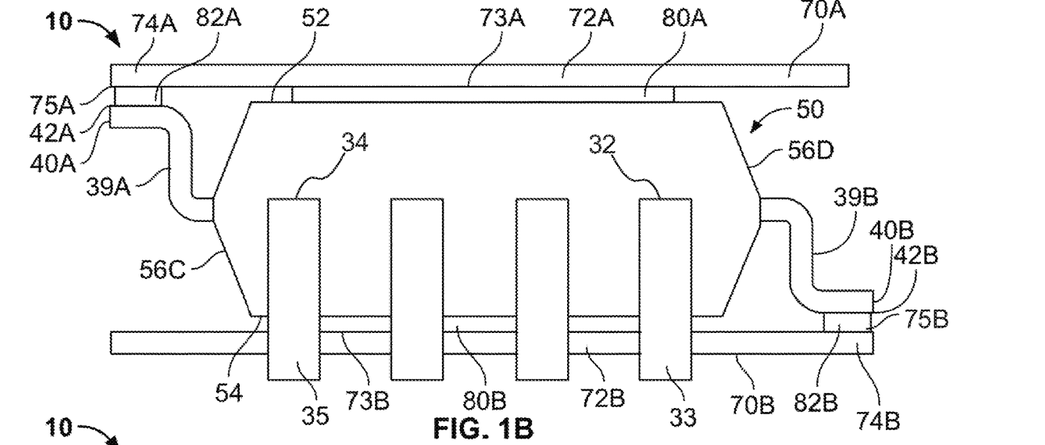
Figure 1C:
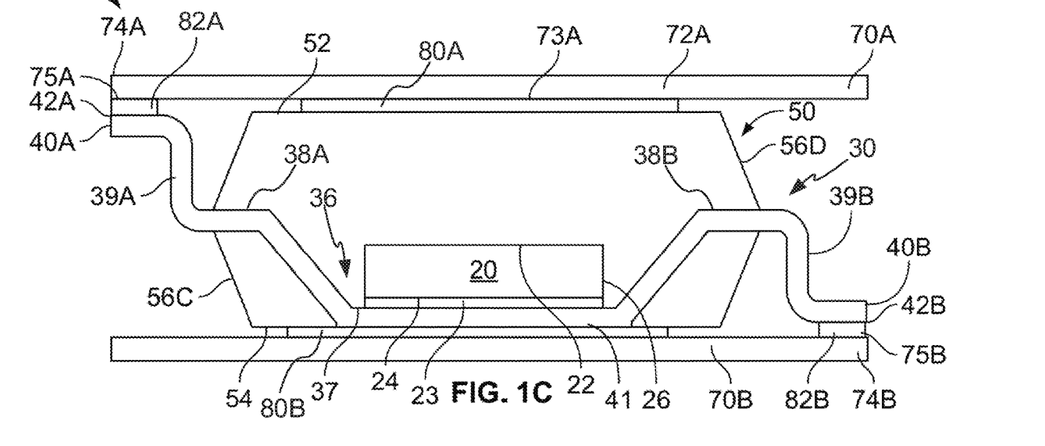
Figure 1D:
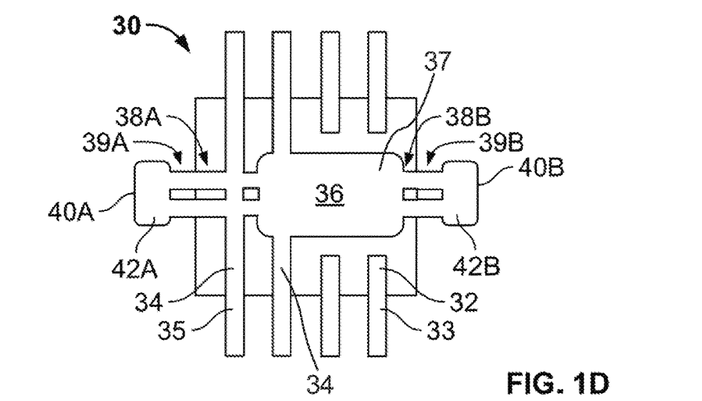
Figure 1E:
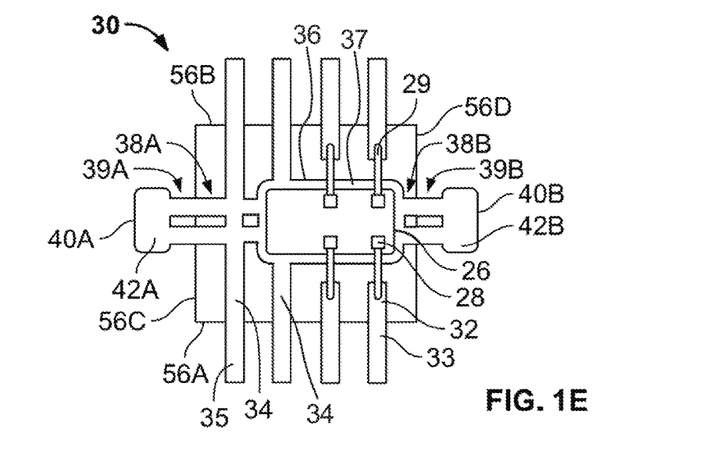
Figures 1F, 1G:
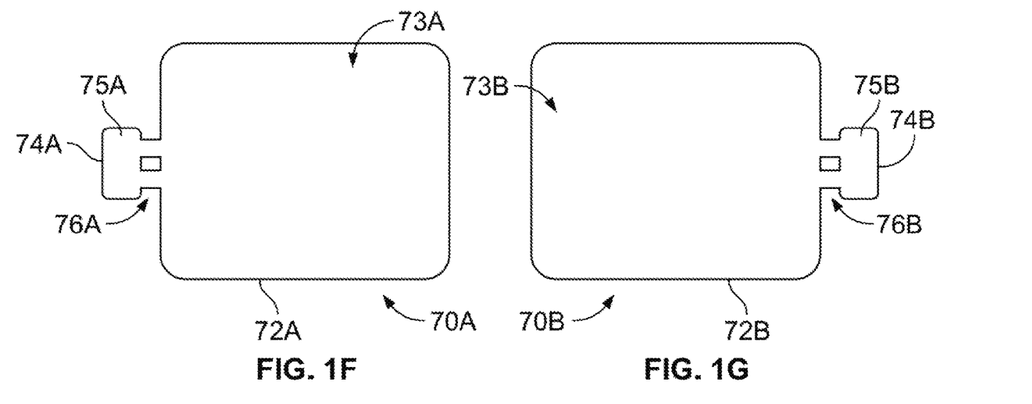

Referring now to FIGS. 1A-1G, aspects of a semiconductor device 10 are shown. In particular, FIG. 1A provides a front view, FIG. 1B provides a side view, FIG. 1C provides a cross-sectional, side view, FIG. 1D provides a cross-sectional, top view, and FIG. 1 E provides another cross-sectional, top view of the semiconductor device 10. Furthermore, FIG. 1F provides a plan view of an upper EMI shield of the semiconductor device 10, and FIG. 1G provides a plan view of a lower EMI shield of the semiconductor device 10. In some examples, semiconductor device 10 can comprise or be referred to as a semiconductor package.

As shown in FIG. 1C, the semiconductor device 10 includes an electronic device 20, a lead frame 30, a package body 50, and EMI shields 70A, 70B coupled to the lead frame 30. The electronic device 20 can include one or more integrated circuits such as a microcontroller, a microprocessor, a network processor, a power management processor, an audio processor, a video processor, an RF circuit, a wireless baseband system-on-chip (SoC) processor, a sensor, a Micro-Electro-Mechanical Systems (MEMS) device, a memory controller, a memory device, an application specific integrated circuit, etc. In some examples, electronic device 20 can comprise or be referred to as a semiconductor die or a semiconductor package. The electronic device 20 can include a top surface 22, a bottom surface 24 opposite the top surface 22, and side surfaces 26 that adjoin the top surface 22 and the bottom surface 24. The top surface 22 can include terminals 28 (see, e.g., FIG. 1E) that provide electrical connections to the integrated circuits of the electronic device 20. In some examples, terminals 28 can comprise or be referred to as die pads, bumps, or pillars. Moreover, the bottom surface 24 can be attached to a die mount structure 36 of the lead frame 30.

The lead frame 30 generally provides structure for electrically and mechanically coupling the semiconductor device 10 to an external component such as a printed circuit board, another semiconductor device, etc. while providing electrical connections between the electronic device 20 of the semiconductor device 10 and the external component. To this end, the lead frame 30 includes signal leads 32, ground leads 34, a die mount structure 36, shield leads 38A, 38B, and shield mounts 40A, 40B. See, e.g., FIGS. 1D and 1E. The signal leads 32 provide signal paths that propagate electrical input and/or output signals between the electronic device 20 and an external component to which the semiconductor device 10 can be mechanically coupled. The ground leads 34 electrically couple portions of the lead frame 30 to an external ground potential. The die mount structure 36 provides an area to which the electronic device 20 can be mounted. To this end, the die mount structure 36 can include a die pad or can include internal portions or ends of leads 32, 34. The die pad can provide a conductive plate to which the electronic device 20 can be mechanically coupled. The internal portions or ends of leads 32, 34 can permit electrically coupling terminals 28 of electronic device 20 to the leads 32, 34 in an alternative flip-chip-on-lead (FCOL) configuration.

The shield mounts 40A, 40B can be coupled to external portions 39A, 39B of shield leads 38A, 38B and can provide mounting surfaces 42A, 42B to which EMI shields 70A, 70B can be electrically and mechanically coupled to lead frame 30. Each shield mount 40A, 4B can be wider than individual leads of the shield leads 38A, 38B and can provide a larger mounting surface 42A, 42B than the individual leads of the shield leads 38A, 38B would provide by themselves. As shown in FIG. 1D, in some embodiments shield leads 38A can comprise multiple leads that can be separated by a gap or can be parallel to each other. Similarly, shield leads 38B can comprise multiple leads that can be separated by a gap or can be parallel to each other. In such embodiments, the shield mount 40A can span distal ends of the multiple shield lead external portions 39A, and the shield mount 40B can span distal ends of the multiple shield lead external portions 39B.

As shown in FIG. 1E, the electronic device 20 and the die mount structure 36 can each have a generally rectangular perimeter. In particular, the die mount structure 36 can be larger than the electronic device 20 to permit mounting the electronic device 20 within the outer perimeter of the die mount structure 36. However, while the electronic device 20 and/or the die mount structure 36 are depicted as having a generally rectangular configuration, other configurations such as generally square, circular, elliptical, hexagonal, etc. are also contemplated. Moreover, in some embodiments, the outer perimeter of the electronic device 20 can extend beyond the outer perimeter of the die mount structure 36 when mounted to a mounting surface 37 of the die mount structure 36.

As shown in FIGS. 1D and 1E, shield leads 38A can be coupled to ground leads 34 thus coupling the shield mount 40A to a ground potential during operation. In the present example shield leads 38A also extend to die mount structure 36, but there can be other embodiments where they don't. Furthermore, die mount structure 36 can be coupled to ground leads 34, and shield leads 38B can be coupled to die mount structure 36. Thus, shield mount 40B, via die mount structure 36, can also be coupled to a ground potential during operation.

The lead frame 30 can be manufactured by mechanically stamping or chemically etching a continuous metal strip. In particular, the lead frame 30 can be manufactured from a sheet of metal material, such as copper (Cu), copper alloy (Cu Alloy), alloy 37 (nickel (Ni) of 37%, iron (Fe) of 55%). Moreover, the lead frame 30 need not have a uniform thickness. For example, portions of the lead frame 30, such as external portions 33, 35 of leads 32, 34 can be undercut via etching for improved encapsulant adhesion during later stages of the fabrication of the semiconductor device 10. Finally, the lead frame 30 can be plated with a conductive metal, such as gold (Au), silver (Ag), nickel (Ni), palladium (Pd), or alloys thereof, as a surface preparation to facilitate bonding.

Moreover, the number, position, and path of the leads 32, 34 can be varied and designed according to the number and position of input/output paths desired in the semiconductor device 10. Additionally, though the lead frame 30 is shown in a rectangular configuration, other configurations such as square, circular, elliptical, hexagonal etc. are contemplated.

In some embodiments, the electronic device 20 can be attached or bonded to the die mount structure 36 using an epoxy, an adhesive film, or adhesive tape. For example, a thermal interface material 23 such as a thermal adhesive or a thermal tape can attach the electronic device 20 to the mounting surface 37 of the die mount structure 36. See, e.g., FIG. 1C. Besides being mechanically or thermally coupled the die mount structure 36, the electronic device 20 can be also electrically coupled to the die mount structure 36. For example, the thermal interface material 23 can be electrically conductive, thus electrically connecting the electronic device 20 to the die mount structure 36. In some embodiments, bumps, pads, or other interconnect structures of the electronic device 20 can be attached to internal lead portions of the die mount structure 36 in order to electrically couple such interconnect structures to respective leads of the lead frame 30.

As shown in FIG. 1E, bond wires 29 can electrically connect terminals 28 of the electronic device 20 to respective signal leads 32. Similarly, bond wires 29 can electrically connect terminals of the electronic device 20 to respective ground leads 34 (not shown). The bond wires 29 can be formed of gold, copper, aluminum, or other conductive materials. Thus, the electrical signals of the electronic device 20 can be transmitted to an external component such as a printed circuit board via the bond wires 29 and the signal leads 32. The bond wires 29 and the signal leads 32 can also be used to facilitate the transmission of electrical signals to and from components external to the electronic device 20 and the semiconductor device 10.

The signal leads 32, ground leads 34, and shield leads 38A, 38B can include external portions 33, 35, 39A, 39B that extend beyond an exterior surface of the package body 50, or that are exposed through the exterior surface of the package body 50. External portions 33, 35 of leads 32, 34 can be used to mount or electrically connect the semiconductor device 10 to another component such as a printed circuit board. External portions 39A, 39B of leads 32, 34 can be used to electrically connect EMI shields 70A, 70B to a ground potential. In addition to external portions 33, 35, 39A, 39B of leads 32, 34, 38A, 38B being exposed, a bottom surface 41 of the die mount structure 36 that is opposite the mounting surface 37 can also be exposed through the exterior surface of the package body 50. Such exposed bottom surface 41 of the die mount structure 36 can provide a thermally conductive path to aid in dissipating heat from the electronic device 20, which can be attached to the opposed mounting surface 37 of the die mount structure 36 and can be surrounded by encapsulant of the package body 50.

The package body 50 generally protects the electronic device 20 from hostile environments and provides structural integrity to semiconductor device 10. To this end, the package body 50 can be formed or molded from an encapsulant material that covers the electronic device 20, bond wires 29, and portions of the lead frame 30. As shown in FIGS. 1A and 1B, the package body 50 generally defines the exterior surface of the semiconductor device 10. In particular, the package body 50 can provide an exterior surface having a body top surface 52, a body bottom surface 54, and one or more body side surfaces 56A-56D. As mentioned above, external portions 33, 35, 39A, 39B of leads 32, 34, 38A, 38B can extend beyond and/or be exposed through the exterior surface of the package body 50. In particular, external potions 33, 35, 39A, 39B of leads 32, 34, 38A, 38B can extend through one or more body side surfaces 56A-56D of the package body 50. As shown in FIG. 1E, the package body 50 can include four body side surfaces 56A-56D. External portions 33 of signal leads 32 and external portions 35 of ground leads 34 can extend beyond body side surface 56A and body side surface 56B that is opposite body side surface 56A. Moreover, external portions 39A of shield leads 38A can extend beyond body side surface 56C, and external portions 39B of shield leads 38B can extend beyond body side surface 56D that is opposite body side surface 56C.

As further shown in FIGS. 1C, external portions 39A, 39B of leads 38A, 38B can extend from a central portion of the body side surfaces 56C, 56D. However, the die mount structure 36 can be positioned such that its bottom surface 41 is coplanar with or proximate to the body bottom surface 54 of the package body 50. As such, lead 38B can extend between a central portion of the body side surface 56D to the die mount structure 36 proximate to the body bottom surface 54 of the package body 50. In some embodiments, the bottom surface 41 of the die mount structure 36 can be positioned such that the bottom surface 41 extends beyond the body bottom surface 54 of the package body 50. In yet other embodiments, the bottom surface 41 of the die mount structure 36 can be positioned such that the bottom surface 41 lies above the plane of the body bottom surface 54 of the package body 50. In such an embodiment, the package body 50 can include a recess in the body bottom surface 54 of the package body 50 that exposes the bottom surface 41 of the die mount structure 36.

Semiconductor device 10 further includes EMI shields 70A, 70B. As shown in FIGS. 1A-1C, the upper EMI shield 70A covers the body top surface 52 of the package body 50 and the lower EMI shield 70B covers the body bottom surface 54 of the package body 50. There can be embodiments where semiconductor device 10 can comprise only one of EMI shields 70A or 70B. As shown in FIGS. 1F and 1G, each EMI shield 70A, 70B can include a shield plate 72A, 72B, a shield mount 74A, 74B, and shield plate leads 76A, 76B that couple the shield mounts 74A, 74B to the shield plates 72A, 72B. Similar to the lead frame 30, each EMI shield 70A, 70B can be manufactured by mechanically stamping or chemically etching a continuous metal strip. In particular, each EMI shield 70A, 70B can be manufactured from a sheet of conductive material, such as copper (Cu), copper alloy (Cu Alloy), alloy 37 (nickel (Ni) of 37%, iron (Fe) of 55%), Corson alloy, Permalloy, and/or other conductive materials.

As shown in FIGS. 1A-1C, EMI shield 70A can be generally planar such that mounting surface 75A of the shield mount 74A is coplanar with mounting surface 73A of the shield plate 72A. As further shown in FIG. 1B and 1C, a mounting surface 42A of the shield mount 40A can also be coplanar with the body top surface 52 of the package body 50. External portions 39A of the shield leads 38A can extend from the body side surface 56C of the package body 50 and angle toward the body top surface 52 to the mounting surface 42A that can be positioned coplanar with the body top surface 52 of the package body 50.

As further depicted in FIGS. 1B and 1C, the mounting surface 73A of the shield plate 72A can be attached to the body top surface 52 of the package body 50 via an adhesive layer 80A. Similarly, the mounting surface 75A of the shield plate 74A can be attached to the shield mount 40A via an adhesive layer 82A. The adhesive layer 80A and the adhesive layer 82A can be formed from a same conductive adhesive material and applied to the body top surface 52 of the package body 50 and the mounting surface 42A of the shield mount 40A via a single application. In this manner, the EMI shield 70A can be electrically coupled, via shield mount 40A and lead frame 30, to a ground potential during operation.

Similarly, EMI shield 70B can be generally planar such that mounting surface 75B of the shield mount 74B is coplanar with mounting surface 73B of the shield plate 72B. As further shown in FIG. 1B and 1C, a mounting surface 42B of the shield mount 40B can also be coplanar with the body bottom surface 54 of the package body 50. External portions 39B of the shield leads 38B can extend from the body side surface 56D of the package body 50 and angle toward the body bottom surface 54 to the mounting surface 42B that can be positioned coplanar with the body bottom surface 54 of the package body 50.

As further depicted in FIGS. 1B and 1C, the mounting surface 73B of the shield plate 72B can be attached to the body bottom surface 54 of the package body 50 via an adhesive layer 80B. Furthermore, the mounting surface 75B of the shield mount 74B can be attached to the shield mount 40B via an adhesive layer 82B. The adhesive layer 80B and the adhesive layer 82B can be formed from a same conductive adhesive material and applied to the body bottom surface 54 of the package body 50 and the mounting surface 42B of the shield mount 40B via a single application. In this manner, the EMI shield 70B can be electrically coupled, via the shield mount 40B and lead frame 30, to a ground potential during operation.

The grounded EMI shields 70A, 70B can help shield integrated circuits of the electronic device 20 from sources of electromagnetic interference that are external to the semiconductor device 10. Conversely, the ground EMI shields 70A, 70B can also help shield components that are external to the semiconductor device 10 from electromagnetic interference generated by integrated circuits of the electronic device 20.

Semiconductor device 10 is illustrated with an upper EMI shield 70A and a lower EMI shield 70B. However, in some examples, a single EMI shield, such as only the upper EMI shield 70A or only the lower EMI shield 70B, can sufficiently attenuate electromagnetic interference. As such, the semiconductor device 10 can be implemented with a single EMI shield 70A or 70B.

Figure 2A:
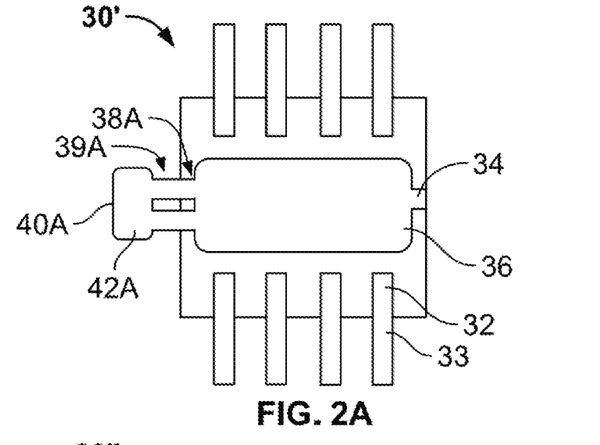
FIGS. 2A and 2B depict lead frames suitable for a semiconductor device having a single EMI shield.
Figure 2B:
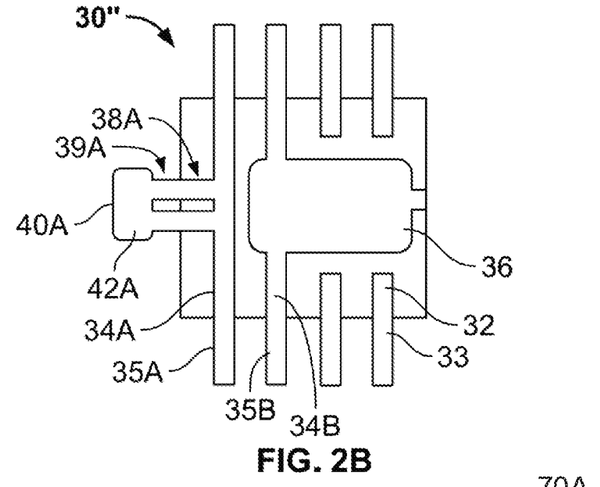

In one example, semiconductor device 10 can be implemented without EMI shield 70B, and the lead frame 30 can be implemented without shield leads 38B or shield mount 40B as shown in FIGS. 2A and 2B. In particular, FIG. 2A depicts a lead frame 30' comprising a die mount structure 36, shield leads 38A coupled to the die mount structure 36, and a shield mount 40A that spans external portions 39A of shield leads 38A. Die mount structure 36 can be exposed at the bottom of package body 50, and can thus be coupled to an external ground potential. Thus, die mount structure 36, leads 38A, and shield mount 40A can provide a ground path to EMI shield 70A mounted to the shield mount 40A.

FIG. 2B depicts another lead frame 30" comprising a die mount structure 36, ground leads 34A, shield leads 38A coupled to ground leads 34A, a shield mount 40A that spans external portions 39A of shield leads 38A, and ground leads 34B coupled to the die mount structure 36. Thus, the ground leads 34A, shield leads 38A, and shield mount 40A can provide a ground path to EMI shield 70A mounted to the shield mount 40A. As such, the EMI shield 70A can be grounded by coupling external portions 35A of the first ground leads 34A to a ground potential external to the package body 50. Similarly, the second ground leads 34B can provide a ground path to the die mount structure 36. In particular, the die mount structure 36 can be grounded by coupling external portions 35B of the second ground leads 34B to a ground potential external to the package body 50. Thus, the EMI shield 70A can be grounded via the first ground leads 34A, 35B and the die mount structure 36 can be grounded via the second ground leads 34B, 35B.

Figure 2C:
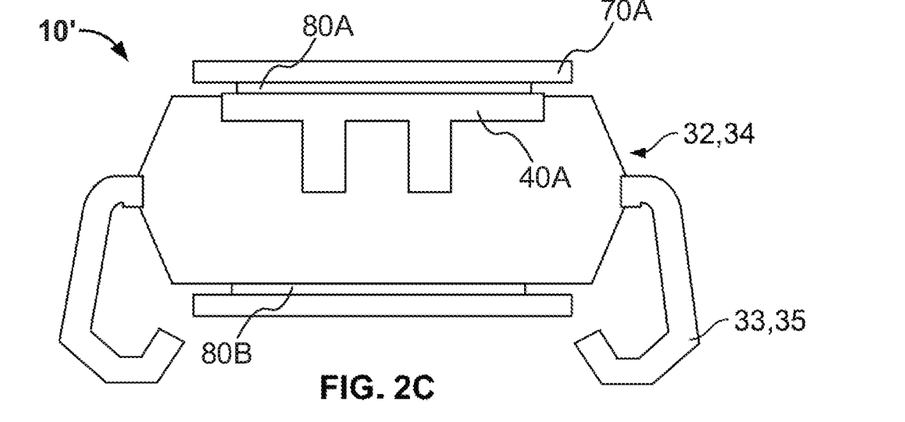
FIG. 2C depicts J-type leads suitable for a semiconductor device.

Furthermore, semiconductor device 10 is illustrated in FIG. 1A with gull wing leads 32, 34. More specifically, each of the external portions 33, 35 of leads 32, 34 has a shape referred to in the industry as gull winged, thus providing the semiconductor device 10 with gull wing leads. As illustrated in FIG. 2C, a semiconductor device 10' can be provided with J-type leads instead. In particular, each of the external portions 33, 35 of leads 32, 34 of FIG. 2C has a shape referred to in the industry as J-type. It should be appreciated that each of the disclosed semiconductor device embodiments described herein can be implemented using gull wing leads, J-type leads, through-hole leads, lead-less leads (see, e.g., FIG. 7B), or some combination of such lead types.

Figure 3A:
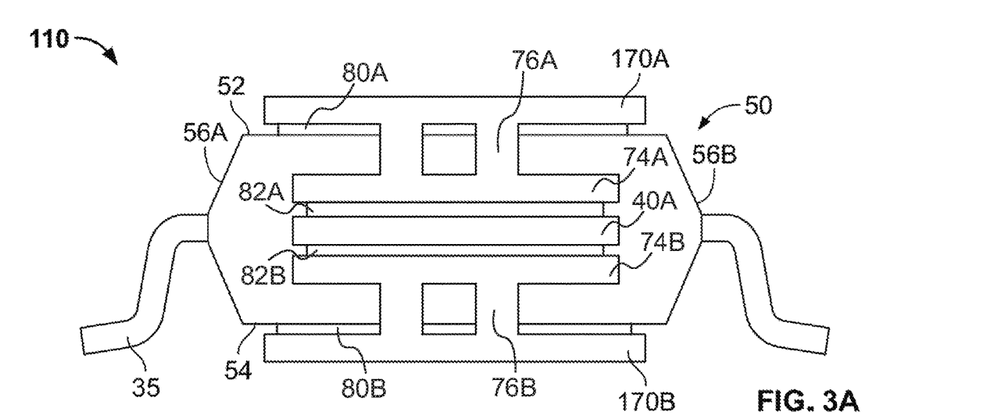
FIGS. 3A-3C depict further aspects of a semiconductor device.
Figure 3B:
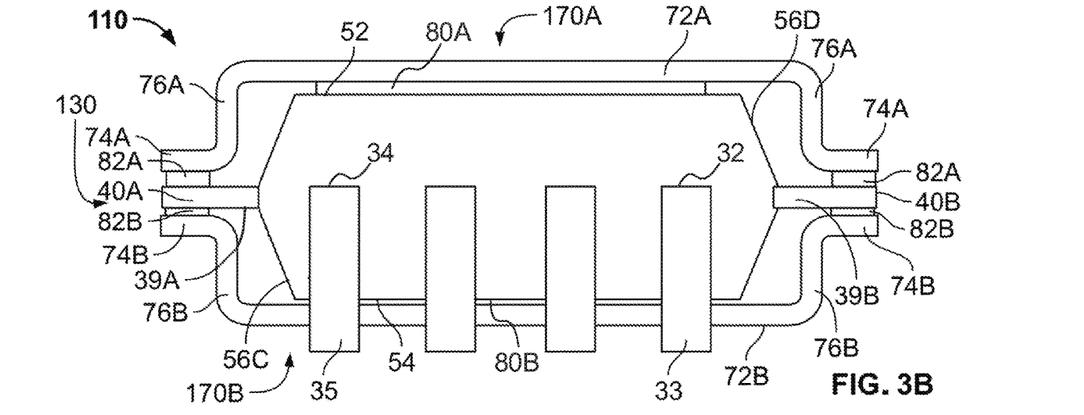
Figure 3C:
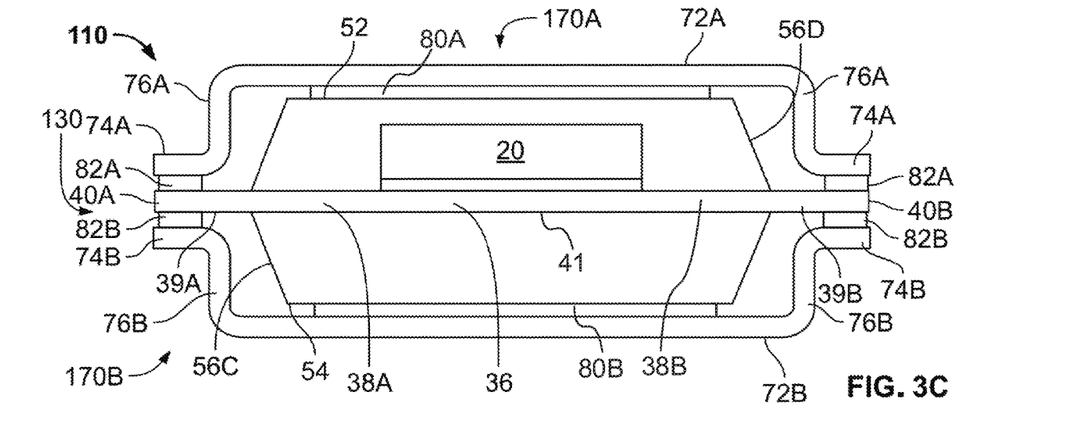

Referring now to FIGS. 3A-3C, aspects of a semiconductor device 110 are shown. FIG. 3A provides a front view, FIG. 3B provides a side view, and FIG. 3C provides a cross-sectional, side view of the semiconductor device 110.

Similar to the semiconductor device 10 of FIGS. 1A-1G, the semiconductor device 110 includes an electronic device 20, a lead frame 130, a package body 50, and EMI shields 70A, 70B electrically coupled to the lead frame 130 via shield mounts 40A, 40B. However, unlike the lead frame 30 of semiconductor device 10, the shield leads 38A, 38B are coplanar with die mount structure 36. In addition, the bottom surface 41 of the die mount structure 36 is not exposed through the body bottom surface 54 of the package body 50. Moreover, the shield mounts 40A, 40B and external portions 39A, 39B of the shield leads 38A, 38B can also lie in the same plane as the die mount structure 36.

The EMI shields 170A, 170B of the semiconductor device 110 can be implemented in a manner similar to the EMI shield 70A, 70B of semiconductor device 10. Like the EMI shield 70A, EMI shield 170A includes a first shield plate mount 74A attached to a first edge of the shield plate 72A via first shield plate leads 76A. EMI shield 170A further includes a second shield mount 74A attached to a second edge of the shield plate 72A via second shield plate leads 76A. As shown, shield mounts 74A can be attached to opposing edges of the shield plate 72A. Similarly, like the EMI shield 70B, EMI shield 170B includes a first shield mount 74B attached to a first edge of the shield plate 72B via first shield plate leads 76B. EMI shield 170B further includes a second shield mount 74B attached to a second edge of the shield plate 72B via second shield plate leads 76B. As shown, shield mounts 74B can be attached to opposing edges of the shield plate 72B. Due to each EMI shield 170A, 170B including two shield mounts 74A, 74B, each EMI shield 170A, 170B can be coupled to an external ground potential via both shield mounts 40A, 40B of the lead frame 130. As seen in FIG. 3B-3C, EMI shields 170A, 170B are not fully planar in this example. Instead, shield plate leads 76A and 76B are instead bent to position shield mounts 74A, 74B for coupling with shield mounts 40A, 40B of leadframe 130.

Figure 4A:
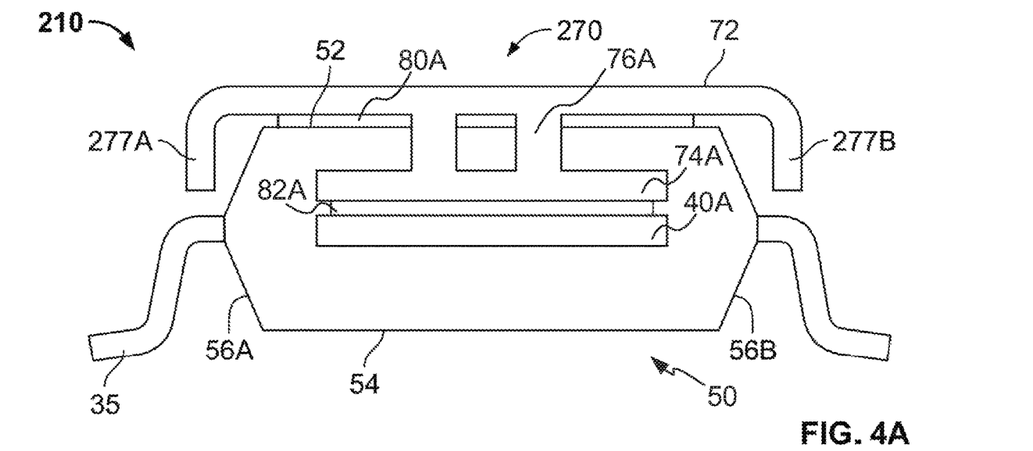
FIGS. 4A-4C depict yet further aspects a semiconductor device.
Figure 4B:
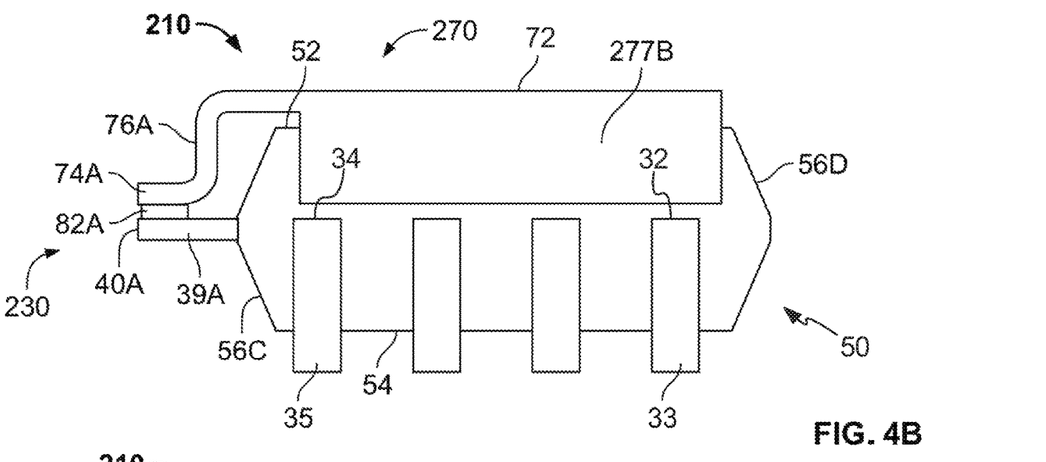
Figure 4C:
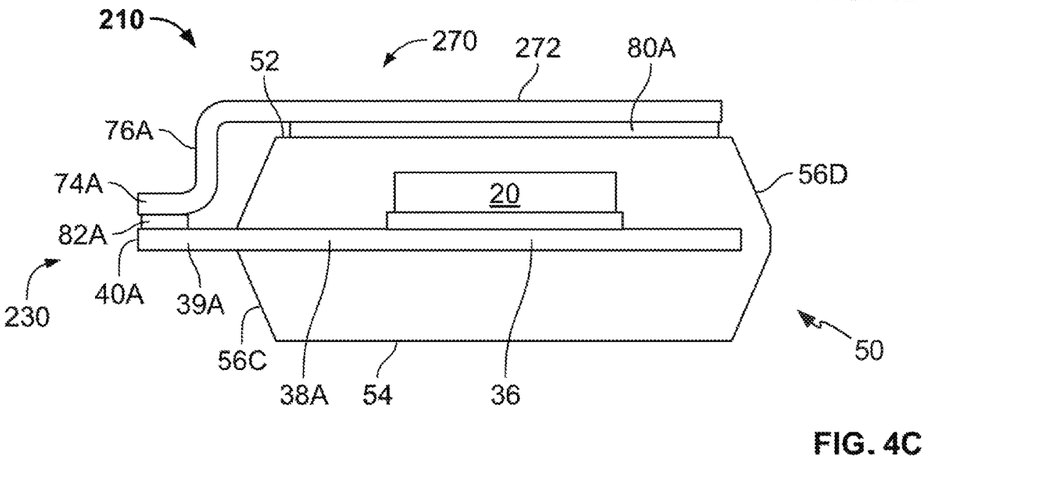

Referring now to FIGS. 4A-4C, aspects of a semiconductor device 210 is shown. FIG. 4A provides a front view, FIG. 4B provides a side view, and FIG. 4C provides a cross-sectional, side view of the semiconductor device 210.

Similar to the semiconductor device 110 of FIGS. 3A-3C, the semiconductor device 210 includes an electronic device 20, a lead frame 230, a package body 50, and an EMI shield 270 electrically coupled to the lead frame 230 via shield mount 40A. As shown in FIGS. 4A and 4B, the EMI shield 270 includes wing portions 277A, 277B that traverse opposite perimeter edges of the shield plate 72. As shown, the wing portions 277A, 277B extend toward the body bottom surface 54 of the package body 50. In the depicted embodiment, the wing portions 277A, 277B terminate before reaching the external portions 33, 35 of leads 32, 34 that extend from body side surfaces 56A, 56B of package body 50. In this manner, the wing portions 277A, 277B of the EMI shield 270 can further aid in attenuating electromagnetic interference entering and/or exiting through the body side surfaces 56A, 56B.

While wing portions 277A, 277B are shown terminating before reaching external portions 33, 35 of leads 32, 34, the wing portions 277A, 277B in other embodiments can extend over the external portions 33, 35 of leads 32, 34 without contacting them. In this manner the wing portions 277A, 277B can further aid in attenuating electromagnetic interference entering and/or exiting through the body side surfaces 56A, 56B and/or external lead portions 33, 35.

Figure 5A:
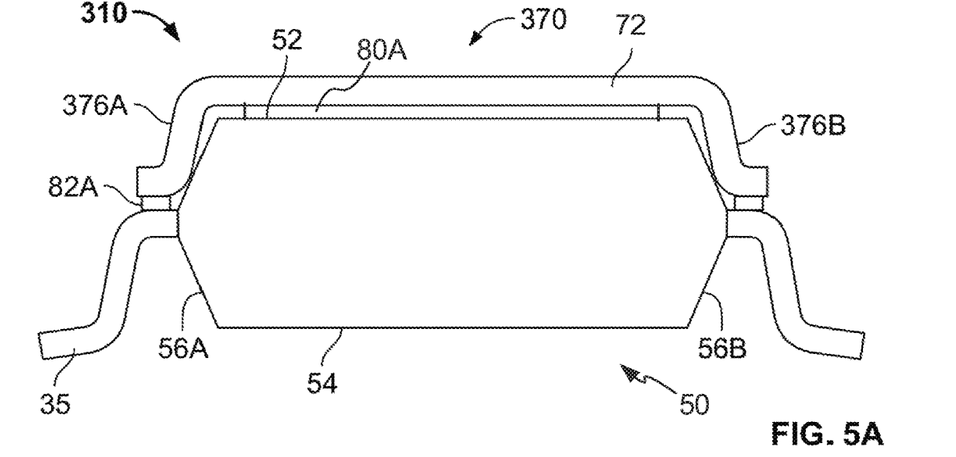
FIGS. 5A-5C depict additional aspects of a semiconductor device.
Figure 5B:
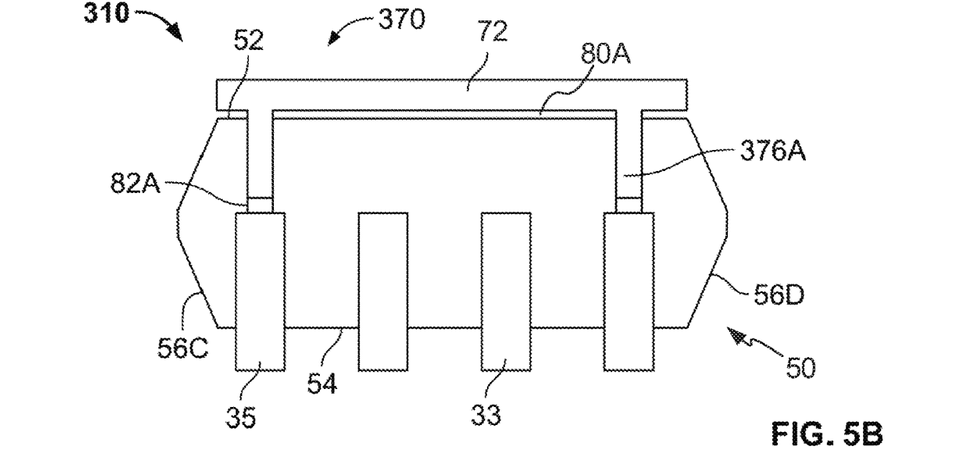
Figure 5C:
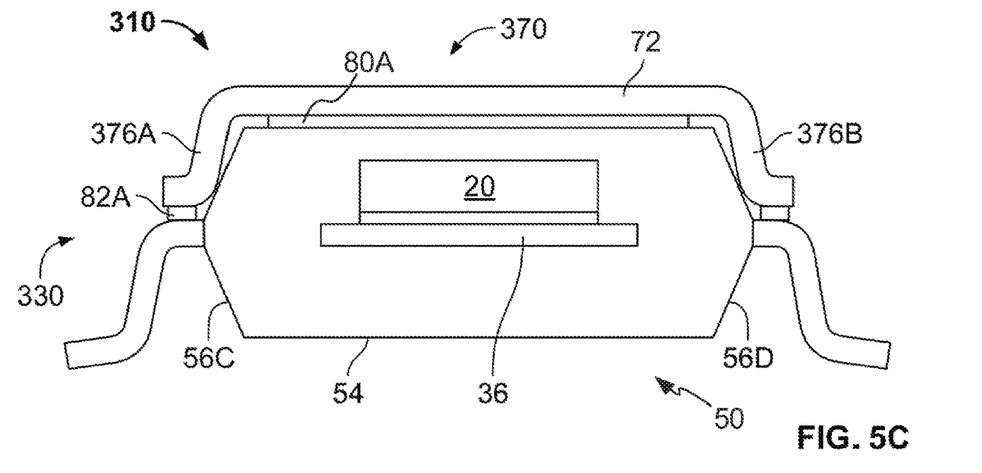

Referring now to FIGS. 5A-5C, aspects of the semiconductor device 310 are shown. FIG. 5A provides a front view, FIG. 5B provides a side view, and FIG. 5C provides a cross-sectional, front view of the semiconductor device 310.

Similar to the semiconductor device 10 of FIGS. 1A-1G, the semiconductor device 310 includes an electronic device 20, a lead frame 330, a package body 50, and an EMI shield 370 electrically coupled to the lead frame 330. However, unlike semiconductor device 10, the lead frame 330 of the semiconductor device 310 does not include shield leads 38A, 38B or their corresponding external portions 39A, 39B. Moreover, the lead frame 330 does not include shield mounts 40A, 40B. Furthermore, unlike semiconductor device 10, the EMI shield 370 does not include a shield mount 74A. Instead, the shield plate 72 can be coupled to external portions 35 of ground leads 34 via shield plate leads 376A, 376B and adhesive layer 82A. In this manner, the EMI shield 370 can be coupled to an external ground potential via shield leads 376A, 376B and external portions 35 of ground leads 34 during operation. In some examples, the areas of external portions 35 of ground leads 34 to which shield plate leads 376A, 376B couple can be referred to as shield mounts.

Figure 6A:
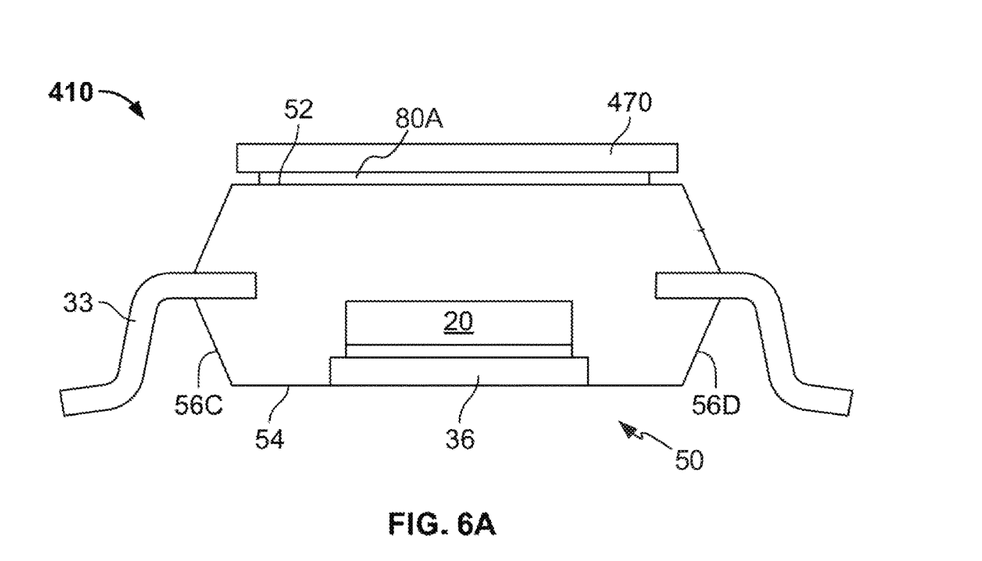
FIGS. 6A-6D depict more aspects of a semiconductor device.
Figure 6B:
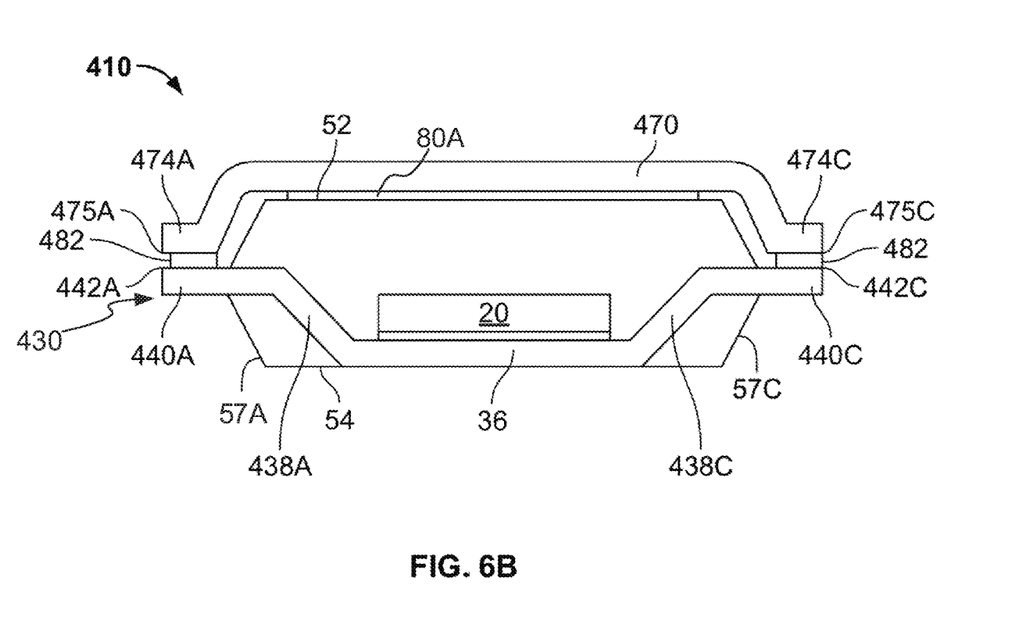
Figure 6C:
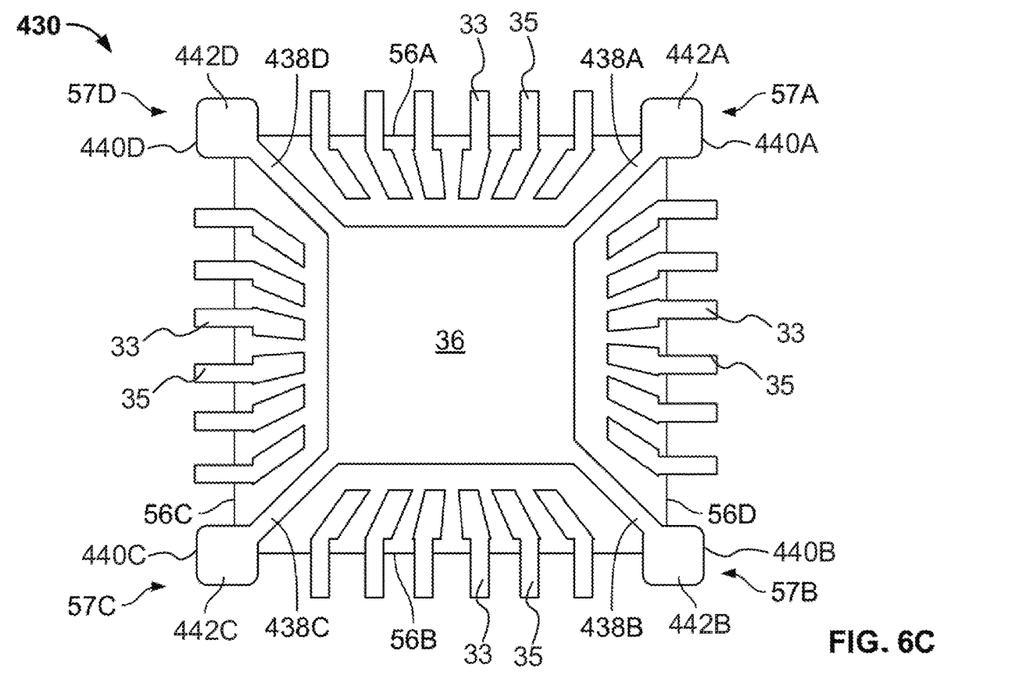
Figure 6D:
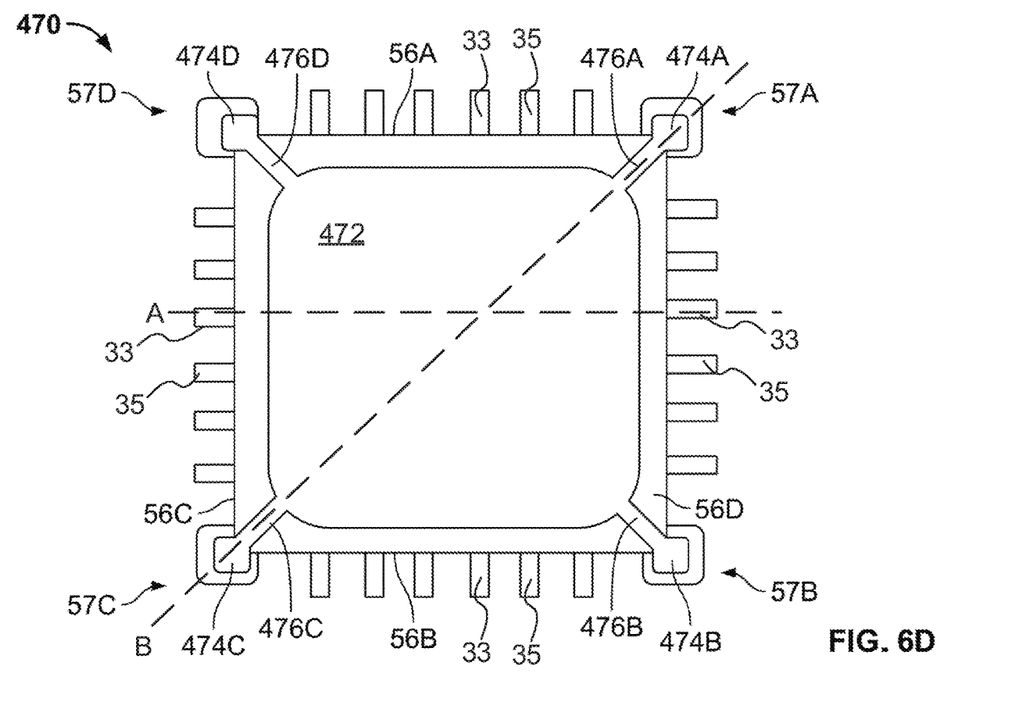

Referring now to FIGS. 6A-6D, another embodiment of a semiconductor device 410 is shown. FIG. 6A provides a cross-sectional front view of the semiconductor device 410 along cross-section line A (See, FIG. 6D). FIG. 6B provides a cross-sectional, diagonal view of the semiconductor device 410 along cross-section line B (See, FIG. 6D). FIG. 6C provides a cross-sectional, top view of the semiconductor device 410. FIG. 6D provides a top view of the semiconductor device 410 with EMI shield 470 coupled to the lead frame 430.

Similar to the semiconductor device 10 of FIGS. 1A-1G, the semiconductor device 410 includes an electronic device 20, a lead frame 430, a package body 50, and an EMI shield 470 electrically coupled to the lead frame 430. However, unlike semiconductor device 10, the lead frame 330 includes external portions 33, 35 of leads 32, 34 that extend from four body side surfaces 56A-56D of the package body 50. As shown, the package body 50 further includes a corner region 57A that adjoins body side surface 56A and body side surface 56D, a corner region 57B that adjoins body side surface 56B and body side surface 56D, a corner region 57C that adjoins body side surface 56B and body side surface 56C, and a corner region 57D that adjoins body side surface 56A and body side surface 56C. The lead frame 430 further includes shield leads 438A-438D or tie-bars that extend to each of the four corner regions 57A-57D of the package body 50. Moreover, the lead frame 430 includes shield mounts 440A-440D respectively positioned at each of the corner regions 57A-57D and coupled to die mount structure 36 via the shield leads 438A-438D.

Similar to the EMI shield 70A of the semiconductor device 10, the EMI shield 470 includes a shield plate 472, shield mounts 474A-474D, shield plate leads 476A-476D that couple the shield mounts 474A-474D to the shield plate 472. See, e.g., FIG. 6D. A mounting surface 475A-475D of each shield mount 474A-474D can be attached to a respective shield mount 440A-440D of the lead frame 430 via an adhesive layer 482. Similar to the adhesive layers 80A, 80B, the adhesive layer 482 can be formed from a same conductive adhesive material and applied to the body top surface 52 of the package body 50 and the mounting surfaces 442A-442D of the shield mounts 440A-440D via a single application. In this manner, the EMI shield 470 can be electrically coupled, via shield mounts 440A-440D and lead frame 430, to a ground potential during operation.

Figure 7A:
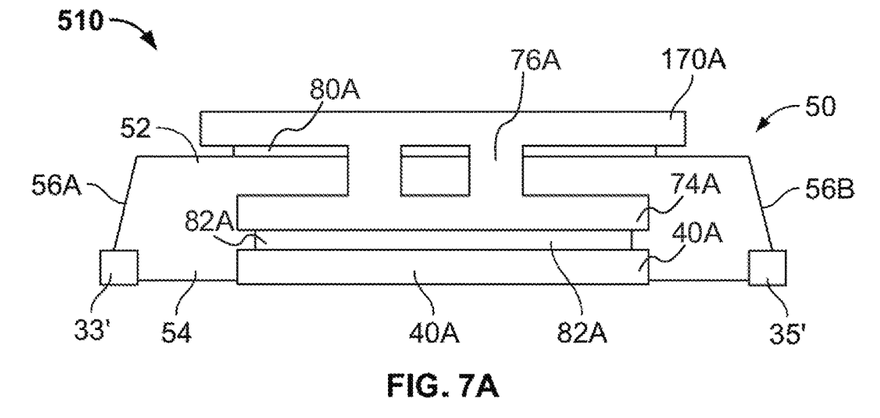
FIGS. 7A-7C depict further aspects of a semiconductor device.
Figure 7B:
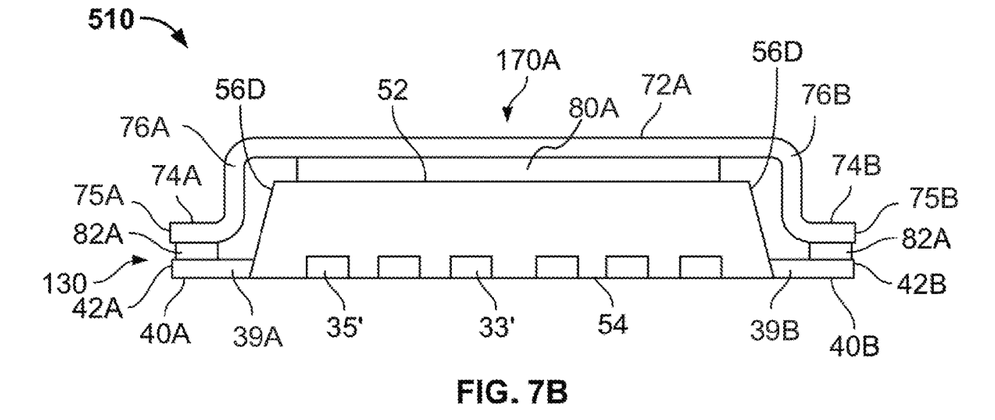
Figure 7C:
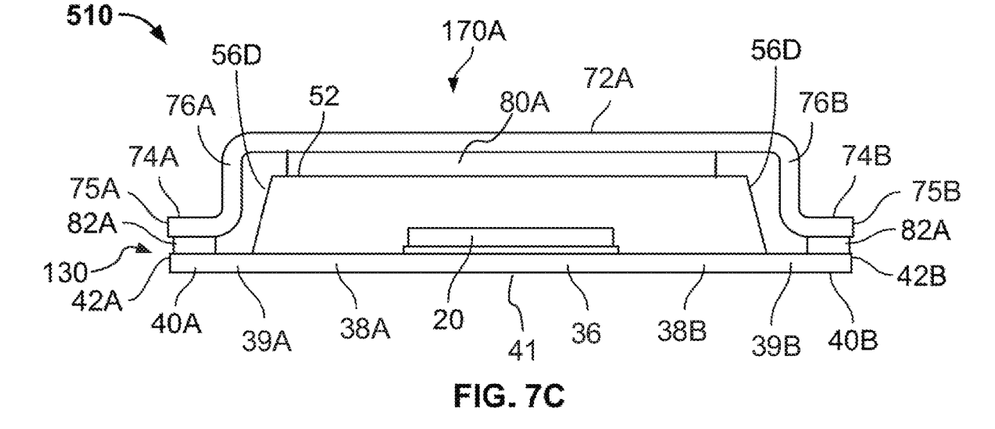

Referring now to FIGS. 7A-7C, aspects of a semiconductor device 510 are shown. FIG. 7A provides a front view, FIG. 7B provides a side view, and FIG. 7C provides a cross-sectional, side view of the semiconductor device 510.

Similar to the semiconductor device 110 of FIGS. 3A-3C, the semiconductor device 510 includes an electronic device 20, a lead frame 130, a package body 50, and an EMI shield 170A electrically coupled to the lead frame 130 via shield mounts 40A, 40B. However, unlike the lead frame 130 of semiconductor device 110, the signal leads 32 and the ground leads 34 essentially lack gull-wing external portions 33, 35 of lead frame 130. Instead, the package body 50 exposes substantially flat external portions 33', 35' of each of leads 32, 34. External portions 33', 35' of leads 32, 34 can be flush with the exterior surface of the package body 50. In some embodiments, the external portions 33', 35' of leads 32, 34 can be exposed via corresponding recesses in the exterior surface of the package body 50. In yet other embodiments, the external portions 33', 35' of leads 32, 34 provide generally planar surfaces raised on the exterior surface of the package body 50.

As further shown, the lead frame 130 aligns with a body bottom surface 54 of the package body 50. As such, like the semiconductor device 10 of FIGS. 1A-1G, the bottom surface 41 of the die mount structure 36 can be exposed through the body bottom surface 54 of the package body 50.

Like the EMI shield 170A of FIGS. 3A-3C, the EMI shield 170A can include shield mounts 74A, 74B attached to opposite perimeter edges of the shield plate 72A via shield plate leads 76A, 76B. Mounting surfaces 75A, 75B of the shield mounts 74A, 74B can be attached to mounting surfaces 42A, 42B of shield mounts 40A, 40B of lead frame 130 via an adhesive layer 82A. Thus, the EMI shield 170A can be coupled to the lead frame 130 via both shield mounts 40A, 40B. As such, the EMI shield 170 can be coupled to an external ground potential via lead frame 130 during operation.

Figure 8A:
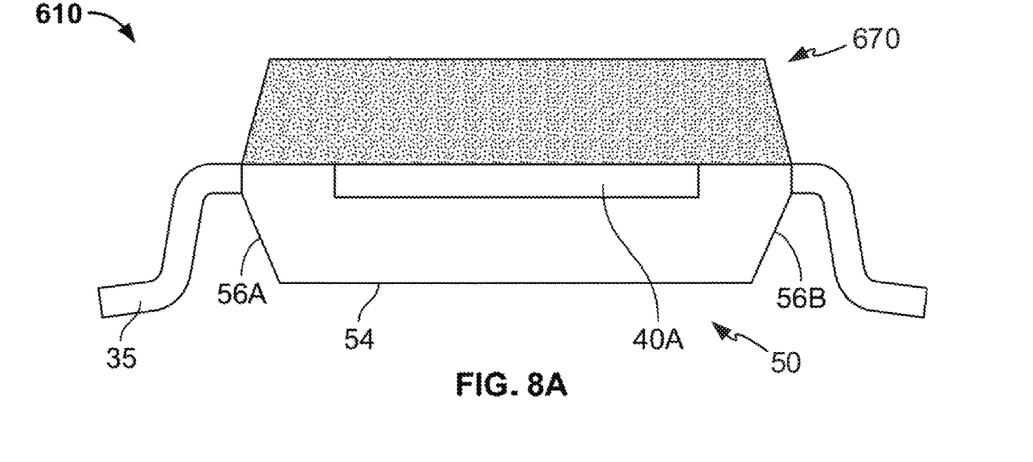
FIGS. 8A-8C depict yet further aspects of a semiconductor device.
Figure 8B:
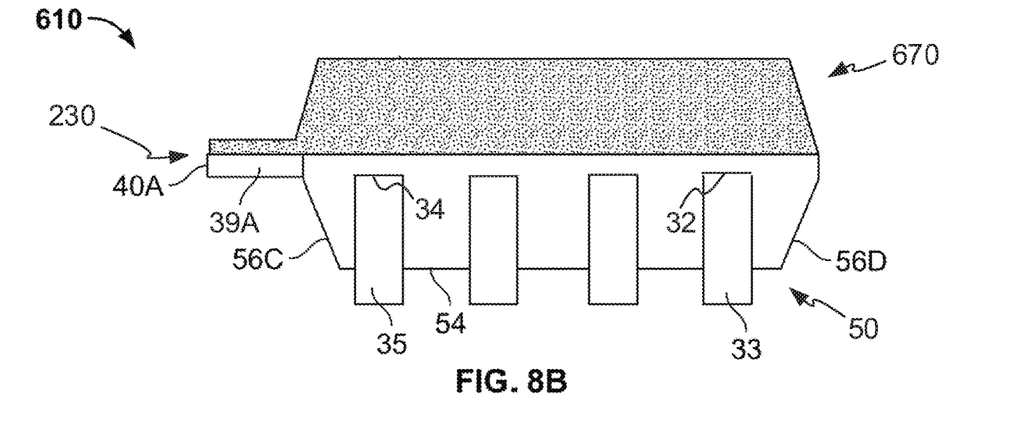
Figure 8C:
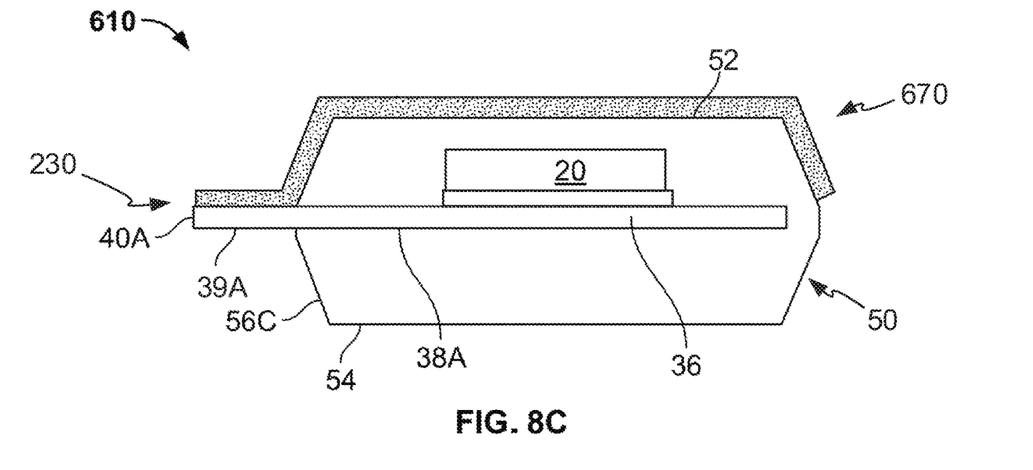

Referring now to FIGS. 8A-8C, aspects of a semiconductor device 610 are shown. FIG. 8A provides a front view, FIG. 8B provides a side view, and FIG. 8C provides a cross-sectional, side view of the semiconductor device 610.

Similar to the semiconductor device 210 of FIGS. 4A-4C, the semiconductor device 610 includes an electronic device 20, a lead frame 230, a package body 50, and an EMI shield 670 electrically coupled to the lead frame 230 via shield mount 40A. However, unlike EMI shield 270, the EMI shield 670 does not include a shield plate 72, shield mounts 74A, 74B, or shield leads 76A, 76B. Instead, the EMI shield 670 comprises a conformal EMI shield that can be sprayed, spread, plated, sputtered, or otherwise dispersed over the body top surface 52 and portions of body side surfaces 56A-56D of the package body 50 as well as shield mount 40A of the lead frame 630. In this manner, the EMI shield 670 provides a conformal, EMI shield that conforms to contours of package body 50 and shield mount 40A of lead frame 630 and that can be coupled to an external ground potential via lead frame 630 during operation.

The present disclosure provides exemplary embodiments. The scope of the present disclosure is not limited by these exemplary embodiments. Numerous variations, whether explicitly provided for by the specification or implied by the specification, such as variations in structure, dimension, type of material and manufacturing process, can be implemented by one skilled in the art in view of this disclosure.

What is claimed is:

1. A semiconductor device, comprising:
   a lead frame comprising a die mount structure, signal leads, a first shield lead, a second shield lead, and a first shield mount;
   an electronic device mounted to the die mount structure and coupled to the signal leads;
   a package body comprising an exterior surface having a body top surface, a body bottom surface opposite the body top surface, and body side surfaces coupling the body top surface to the body bottom surface, wherein the package body encapsulates the electronic device and the lead frame;
   a first shield plate coupled to the first shield mount at a location external to the package body;
   a second shield plate coupled to the first shield mount, wherein the second shield plate covers a portion of the body bottom surface of the package body;
   a first adhesive layer that adheres a lower side of the first shield plate to the body top surface;
   wherein the first shield lead includes a first shield lead external portion that extends beyond the package body;
   wherein the second shield lead includes a second shield lead external portion that extends beyond the package body; and
   wherein the first shield mount is coupled to the first shield lead and the second shield lead at the first shield lead external portion and the second shield lead external portion.

2. The semiconductor device of claim 1, wherein:
   the signal leads comprise signal lead distal ends that extend to a common plane and permit coupling the semiconductor device to a surface of another component;
   the first shield lead comprises a first shield lead distal end that extends short of the common plane to which the signal lead distal ends extend; and
   the second shield lead comprises a second shield lead distal end that extends short of the common plane to which the signal lead distal ends extend.

3. The semiconductor device of claim 2, wherein:
   the first shield mount is coupled to the first shield lead at the first shield lead distal end and to the second shield lead at the second shield lead distal end; and
   the first shield plate and the second shield plate are coupled to the first shield lead and the second shield lead via the first shield mount.

4. The semiconductor device of claim 2, wherein the first shield mount:
   extends laterally across the first shield lead distal end and the second shield lead distal end; and
   provides a mounting surface wider than a lateral distance between the first shield lead distal end and the second shield lead distal end.

5. The semiconductor device of claim 1, wherein the first shield plate comprises one or more first shield plate leads that couple the first shield plate to the first shield mount.

6. The semiconductor device of claim 5, wherein the second shield plate comprises one or more second shield plate leads that couple the second shield plate to the first shield mount.

7. The semiconductor device of claim 1, further comprising a second adhesive layer that adheres an upper side of the second shield plate to the body bottom surface.

8. The semiconductor device of claim 1, wherein each of the signal leads comprises a gull wing lead or a J-type lead.

9. A semiconductor device, comprising:
   a lead frame comprising a die mount structure, signal leads, a first shield lead, a second shield lead, a first shield mount, and a second shield mount;
   an electronic device mounted to the die mount structure and coupled to the signal leads;
   a package body comprising an exterior surface having a body top surface, a body bottom surface opposite the body top surface, and body side surfaces coupling the body top surface to the body bottom surface, wherein the package body encapsulates the electronic device and the lead frame;
   a first shield plate coupled to the first shield mount at a location external to the package body; and
   a first adhesive layer that adheres a lower side of the first shield plate to the body top surface;
   wherein the first shield lead includes a first shield lead external portion that extends beyond the package body;
   wherein the second shield lead includes a second shield lead external portion that extends beyond the package body;
   wherein the first shield mount is coupled to the first shield lead and the second shield lead at the first shield lead external portion and the second shield lead external portion;
   wherein the first shield mount extends beyond a first side surface of the package body;
   wherein the second shield mount extends beyond a second side surface of the package body that is opposite the first side surface; and wherein the first shield plate is coupled to the second shield mount at a location external to the package body.

10. The semiconductor device of claim 9, wherein:
the signal leads comprise signal lead distal ends that extend to a common plane and permit coupling the semiconductor device to a surface of another component;
the first shield lead comprises a first shield lead distal end that extends short of the common plane to which the signal lead distal ends extend; and
the second shield lead comprises a second shield lead distal end that extends short of the common plane to which the signal lead distal ends extend.

11. The semiconductor device of claim 10, wherein:
the first shield mount is coupled to the first shield lead at the first shield lead distal end and to the second shield lead at the second shield lead distal end; and
the first shield plate is coupled to the first shield lead and the second shield lead via the first shield mount.

12. The semiconductor device of claim 11, wherein the first shield mount:
extends laterally across the first shield lead distal end and the second shield lead distal end; and
provides a mounting surface that is wider than a lateral distance between the first shield lead distal end and the second shield lead distal end.

13. The semiconductor device of claim 9, wherein the first shield plate comprises one or more first shield plate leads that couple the first shield plate to the first shield mount.

14. The semiconductor device of claim 13, wherein the first shield plate comprises one or more second shield plate leads that couple the first shield plate to the second shield mount.

15. The semiconductor device of claim 9, wherein the second shield mount:
extends laterally across a third shield lead and a fourth shield lead of the lead frame; and
provides a mounting surface that is wider than a lateral distance between the third shield lead and the fourth shield lead.

16. The semiconductor device of claim 9, wherein the body bottom surface exposes the die mount structure.

17. The semiconductor device of claim 9, wherein each of the signal leads comprises a gull wing lead or a J-type lead.

18. A method, comprising:
encapsulating a lead frame and an electronic device in a package body comprising an exterior surface having a body top surface, a body bottom surface opposite the body top surface, and body side surfaces coupling the body top surface to the body bottom surface, the lead frame comprising a die mount structure, signal leads, a first shield lead, a second shield lead, and a first shield mount, the electronic device mounted to the die mount structure and coupled to the signal leads, the first shield lead includes a first shield lead external portion that extends beyond the package body, the second shield lead includes a second shield lead external portion that extends beyond the package body, and the first shield mount is coupled to the first shield lead and the second shield lead at the first shield lead external portion and the second shield lead external portion;
adhering a lower side of a first shield plate to the body top surface via a first adhesive layer; and
coupling the first shield plate to the first shield mount at a location external to the package body; and
at least one of:
coupling a second shield plate to the first shield mount, wherein the second shield plate covers a portion of the body bottom surface of the package body; or
coupling the first shield plate to a second shield mount that extends beyond a second side surface of the package body that is opposite a first side surface of the package body beyond which the first shield mount extends such that the first shield plate is coupled to the second shield mount at a location external to the package body.

19. The method of claim 18, comprising coupling the second shield plate to the first shield mount, wherein the second shield plate covers the portion of the body bottom surface of the package body.

20. The method of claim 18, comprising coupling the first shield plate to the second shield mount that extends beyond the second side surface of the package body that is opposite the first side surface of the package body beyond which the first shield mount extends such that the first shield plate is coupled to the second shield mount at the location external to the package body.

* * * * *